(12) United States Patent
Arai

(10) Patent No.: US 11,282,818 B2
(45) Date of Patent: Mar. 22, 2022

(54) SEMICONDUCTOR DEVICE

(71) Applicant: KIOXIA CORPORATION, Tokyo (JP)

(72) Inventor: Toshimitsu Arai, Kanagawa (JP)

(73) Assignee: KIOXIA CORPORATION, Tokyo (JP)

( * ) Notice: Subject to any disclaimer, the term of this patent is extended or adjusted under 35 U.S.C. 154(b) by 15 days.

(21) Appl. No.: 16/805,239

(22) Filed: Feb. 28, 2020

(65) Prior Publication Data

US 2021/0082878 A1 Mar. 18, 2021

(30) Foreign Application Priority Data

Sep. 12, 2019 (JP) .............................. JP2019-166233

(51) Int. Cl.
*H01L 25/065* (2006.01)
*H01L 23/00* (2006.01)
*H01L 25/00* (2006.01)

(52) U.S. Cl.
CPC .......... *H01L 25/0657* (2013.01); *H01L 24/32* (2013.01); *H01L 24/33* (2013.01); *H01L 24/73* (2013.01); *H01L 24/83* (2013.01); *H01L 25/50* (2013.01); *H01L 2224/32145* (2013.01); *H01L 2224/32225* (2013.01); *H01L 2224/3303* (2013.01); *H01L 2224/33181* (2013.01);
(Continued)

(58) Field of Classification Search
CPC ..... H01L 25/0657; H01L 24/73; H01L 25/50; H01L 24/32; H01L 24/83; H01L 2225/06562; H01L 2225/0651; H01L 2225/06582; H01L 2225/06575; H01L 2924/3511; H01L 2224/73265; H01L 2224/32145; H01L 2224/32225; H01L 2224/73215; H01L 2224/33181; H01L 24/33

See application file for complete search history.

(56) References Cited

U.S. PATENT DOCUMENTS 6,992,396 B2 * 1/2006 Arai .................... H01L 25/0657
257/777
10,446,527 B2 10/2019 Nakano
(Continued)

FOREIGN PATENT DOCUMENTS

| JP | 2001035884 A | 2/2001 |
| JP | 2012138394 A | 7/2012 |

(Continued)

*Primary Examiner* — Jasmine J Clark
(74) *Attorney, Agent, or Firm* — Kim & Stewart LLP

(57) ABSTRACT

A semiconductor device in an embodiment includes a first chip on a substrate and a second chip adhered to a first region of the first chip using a first adhesive layer. The second chip is positioned so a second region of the first semiconductor is not overlapped. The first adhesive layer covers a lower surface of the second chip but not the second region. A third chip is adhered to a third region of the second chip with a second adhesive layer. The third chip is positioned so a fourth region of the second chip is not overlapped. The second adhesive layer covers a lower surface of the third chip but not the fourth region. An end of the second adhesive layer is above the second region, but not contacting. A coating covers the fourth region and the ends of the second adhesive layer and third chip.

20 Claims, 7 Drawing Sheets

(52) U.S. Cl.
CPC .............. *H01L 2224/73215* (2013.01); *H01L 2224/73265* (2013.01); *H01L 2224/8392* (2013.01); *H01L 2224/83862* (2013.01); *H01L 2225/0651* (2013.01); *H01L 2225/06506* (2013.01); *H01L 2225/06562* (2013.01); *H01L 2225/06582* (2013.01); *H01L 2924/3511* (2013.01)

(56) References Cited

U.S. PATENT DOCUMENTS

| | | | |
|---|---|---|---|
| 2003/0178710 A1* | 9/2003 | Kang | H01L 25/0657 257/673 |
| 2007/0218586 A1* | 9/2007 | Yoshimura | H01L 24/32 438/106 |
| 2008/0241995 A1* | 10/2008 | Fukui | C08G 59/44 438/109 |
| 2013/0062782 A1* | 3/2013 | Yoshimura | H01L 21/6836 257/777 |
| 2013/0114323 A1 | 5/2013 | Shindo et al. | |
| 2013/0137217 A1* | 5/2013 | Kindo | H01L 21/561 438/109 |
| 2018/0253375 A1 | 9/2018 | Arai | |

FOREIGN PATENT DOCUMENTS

| | | |
|---|---|---|
| JP | 2017026382 A | 2/2017 |
| WO | 2019046019 A1 | 3/2019 |

\* cited by examiner

SEMICONDUCTOR DEVICE

CROSS-REFERENCE TO RELATED APPLICATION(S)

This application is based upon and claims the benefit of priority from Japanese Patent Application No. 2019-166233, filed Sep. 12, 2019, the entire contents of which are incorporated herein by reference.

FIELD

Embodiments described herein relate generally to a semiconductor device.

BACKGROUND

A multi-chip package (MCP) in which a plurality of semiconductor chips are mounted within one semiconductor package is known.

DETAILED DESCRIPTION

A semiconductor device having improved reliability can be provided according to at least one embodiment.

In general, according to one embodiment, a semiconductor device includes a wiring substrate, a first semiconductor chip on the wiring substrate, and a second semiconductor chip adhered to a first region of an upper surface of the first semiconductor chip with a first adhesive layer. The second semiconductor chip is positioned such that a second region of the upper surface of the first semiconductor is not overlapped by the second semiconductor chip. The first adhesive layer covers a lower surface of the second semiconductor chip but does not cover the second region. A third semiconductor chip is adhered to a third region of an upper surface of the second semiconductor chip with a second adhesive layer. The third semiconductor chip is positioned such that a fourth region of the upper surface of the second semiconductor chip is not overlapped by the third semiconductor chip. The second adhesive layer covers a lower surface of the third semiconductor chip but does not cover the fourth region. An end portion of the second adhesive layer is above the second region, but does not contacts the second region. A coating covers the fourth region, an end surface of the second adhesive layer adjacent to the fourth region, and an end surface of the third semiconductor chip adjacent to the end surface of the second adhesive layer.

Hereinafter, certain example embodiments will be described with reference to the drawings.

Figure 1:
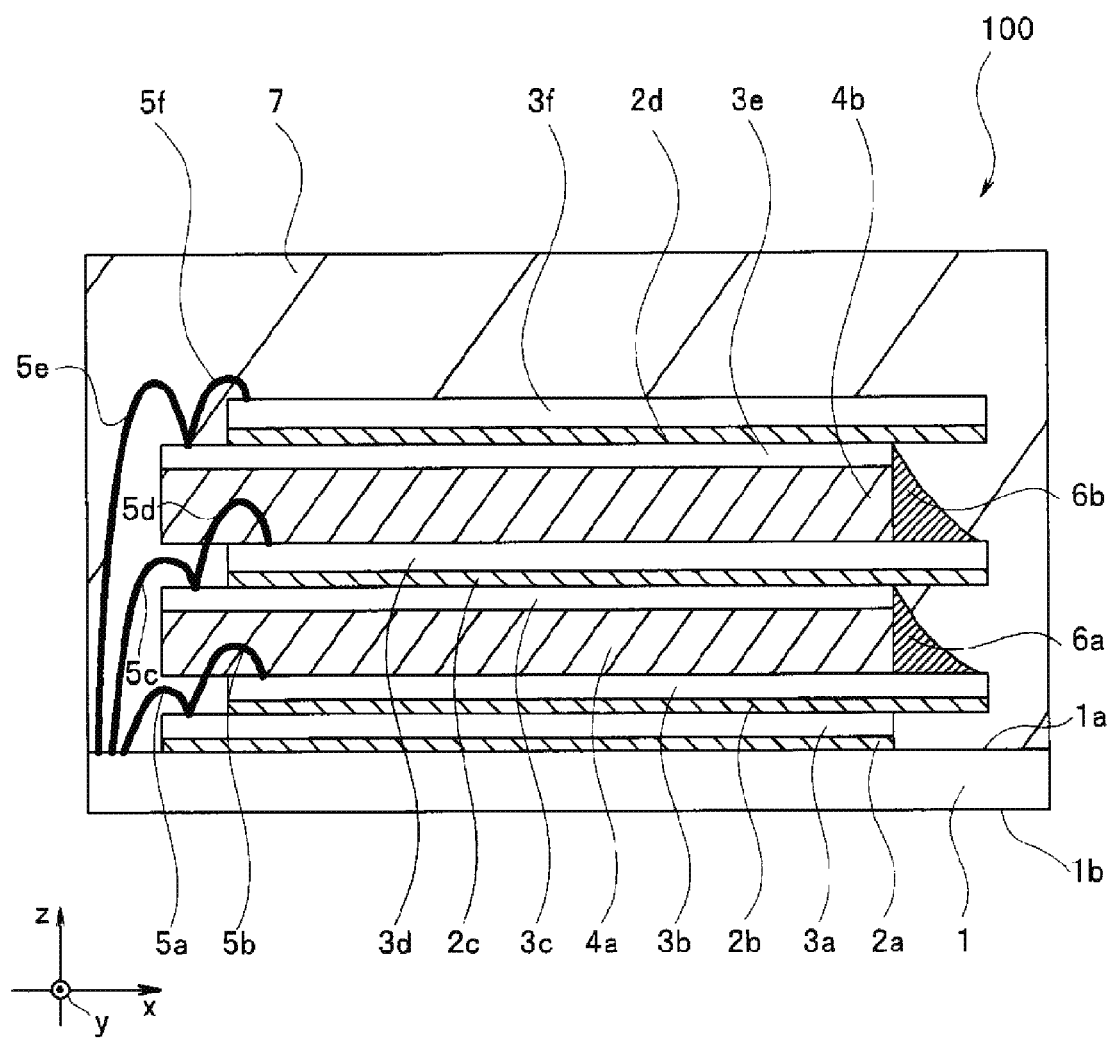
FIG. 1 is a cross-sectional view depicting a semiconductor device according to an embodiment.

FIG. 1 is a cross-sectional view showing the structure of a semiconductor device according to the present embodiment. In the following description, an orthogonal, xyz coordinate system is used for explanatory convenience. In this context, a plane parallel to the main surfaces of a wiring substrate 1 in semiconductor device 100 is set as an xy-plane, and a direction orthogonal to the xy-plane is set as a z-axis direction. Thus, the x-axis and the y-axis are orthogonal to each other in the xy-plane. In the following description, for the explanatory convenience, description is made assuming that a first element/component positioned relative to a second element/component at position further along the z-axis in a positive direction can be referred to as being "above" the second element/component. Movement along the z-axis (or parallel thereto) in the positive direction may be referred to as movement in an "upward" direction. Similarly, an element/component, or a portion thereof, that is on the positive z-axis side of another element/component or portion thereof, may be referred to as the "upper" element/component of portion thereof. For example, the first surface 1a of the substrate 1 can be referred to as the upper side or an upper surface of substrate 1. Likewise, relative positions along the z-axis in a negative direction may be referred to as being "below" or "lower than" other positions and movements in the along the z-axis (or parallel thereto) in the negative direction may be referred to as "downward." Similarly, an element/component, or a portion thereof, that is on the negative z-axis side of another element/component or portion thereof, may be referred to as the "lower" element/component of portion thereof. For example, the second surface 1b of the substrate 1 can be referred to as the lower side or lower surface of substrate 1. However, as noted, these various terms have been adopted for explanatory convenience and the various positional relationships in the various possible embodiments of the present disclosure are not limited to any particular orientation of the coordinate system with respect to gravitational direction, center of the Earth, or the like.

FIG. 1 shows an xz cross section corresponding to a cutting of semiconductor device 100 in a direction parallel to the xz-plane. In the following description, although the description is made by reference to the structure of the xz cross section, a similar structure may be provided by a cross section other than the xz cross section, such as a yz cross section.

The semiconductor device 100 shown in FIG. 1 includes a wiring substrate 1. The wiring substrate 1 is, for example, an insulating resin wiring substrate or a ceramic wiring substrate having a wiring layer(s) provided on a surface or inside thereof. Specifically, in this example, a printed wiring substrate (also referred to as a printed circuit board) using glass-epoxy resin is used for wiring substrate 1. Alternatively, a silicon interposer, a lead frame or the like may be used.

The wiring substrate 1 has a first surface 1a and a second surface 1b. On the second surface 1b, external terminals for ball grid array (BGA) packaging, land grid array (LGA) packaging or the like can be provided. In this context, external terminals for BGA packaging comprise protruding terminals formed using solder balls or the like and external terminals for LGA packaging comprise metal lands formed using metal plating or the like. The specific illustration of the external terminals is omitted.

A plurality of semiconductor chips (semiconductor chips 3a to 3f) is provided on the first surface 1a of the wiring substrate 1. Hereinafter, when a distinction between the semiconductor chips 3a to 3f is not required, the semiconductor chips 3a to 3f can each more simply referred to as a semiconductor chip 3. Among the semiconductor chips 3a to 3f, the one arranged on the lowermost side in the z-direction is the semiconductor chip 3a. Above the semiconductor chip 3a, the semiconductor chips 3b, 3c, 3d, 3e, and 3f are sequentially stacked in the z-axis positive direction.

The position of semiconductor chip 3b is shifted relative to the semiconductor chip 3a by a predetermined distance (for example, about 300 μm) in the x-axis positive direction. The semiconductor chip 3c is shifted relative to the semiconductor chip 3b by a predetermined distance (for example, about 300 μm) in the x-axis negative direction. The position of semiconductor chip 3d is shifted relative to the semiconductor chip 3c by a predetermined distance (for example, about 300 μm) in the x-axis positive direction. The position of semiconductor chip 3e is shifted relative to the semiconductor chip 3d by a predetermined distance (for example, about 300 μm) in the x-axis negative direction. The position of the semiconductor chip 3f is shifted relative to the semiconductor chip 3e by a predetermined distance (for example, about 300 μm) in the x-axis positive direction. That is, only a portion of the upper surface of each of the semiconductor chips 3a-3d is covered by the semiconductor chip 3 directly above in the stack.

Each semiconductor chip 3 is, for example, a NAND flash memory chip, but is not limited thereto, and any, in general, any type of semiconductor chip may be used. In FIG. 1, a structure in which six semiconductor chips 3 are stacked is described, but the total number of semiconductor chips 3 can be freely chosen so long as there are at least three.

Adhesive layers are included between adjacent semiconductor chips 3. An adhesive layer is also between semiconductor chip 3a and the wiring substrate 1. Each semiconductor chip 3 has its entire lower surface covered by an adhesive layer. In particular, adhesive layer 2a is between the wiring substrate 1 and the semiconductor chip 3a; adhesive layer 2b is between adjacent semiconductor chips 3a and 3b; adhesive layer 4a is between adjacent semiconductor chips 3b and 3c; adhesive layer 4b is between adjacent semiconductor chips 3c and 3d; and adhesive layer 2d is between adjacent semiconductor chips 3d and 3f. The adhesive layers 2a-d and the adhesive layers 4a and 4b are each film-like layers of adhesive materials formed by thermosetting resins (for example, epoxy resins, polyimide resins, acrylic resins, or mixed resins thereof). Theses layers can have different thicknesses according to particular applications. Generally, the adhesive layers 2a-d have a thickness of about 5 μm to 20 μm. The adhesive layer 4 used for bonding semiconductor chips stacked while embedding a conductive wire 5 used to electrically connect the semiconductor chip 3 and the wiring substrate 1, or a conductive wire 5 used to electrically connect a semiconductor chip 3 and another semiconductor chip 3 has a thickness of about 40 μm to 60 μm. In the following description, an adhesive layer, such as each of adhesive layers 2a-d, that does not have a conductive wire 5 embedded therein can be referred to as a die attach film (DAF) 2. An adhesive layer, such as each of adhesive layers 4a and 4b, in which a conductive wire 5 is embedded, is referred to as a film on wire (FOW) 4. In this context, a "conductive wire 5" refers to one of conductive wires 5a to 5f depicted in FIG. 1, but when distinction between the conductive wires 5a to 5f is not required in the specification, these may be more simply referred to as a conductive wire 5. Each conductive wire 5 is an example of a conductive member and may be referred to as a bonding wire in some contexts. In other examples, a conductive member that is not in a wire form may be used to provide electrical connections between a semiconductor chip 3 and the wiring substrate 1 or between different pairs of semiconductor chips 33.

Each semiconductor chip 3 is fixed to the wiring substrate 1 or adjacent semiconductor chip 3 via one a DAF 2 or a FOW 4. Specifically, the semiconductor chip 3a is fixed to the wiring substrate 1 via a DAF 2a. The semiconductor chip 3b is fixed to the semiconductor chip 3a via a DAF 2b. The semiconductor chip 3c is fixed to the semiconductor chip 3b via a FOW 4a. The semiconductor chip 3d is fixed to the semiconductor chip 3c via a DAF 2c. The semiconductor chip 3e is fixed to the semiconductor chip 3d via a FOW 4b. The semiconductor chip 3f is fixed to the semiconductor chip 3e via a DAF 2d.

The semiconductor chip 3a and the wiring substrate 1 are electrically connected by a conductive wire 5a. The semiconductor chip 3b and the wiring substrate 1 are electrically connected by a conductive wire 5b. The semiconductor chip 3c and the wiring substrate 1 are electrically connected by a conductive wire 5c. The semiconductor chip 3d and the wiring substrate 1 are electrically connected by a conductive wire 5d. The semiconductor chip 3e and the wiring substrate 1 are electrically connected by a conductive wire 5e. The semiconductor chip 3f and the wiring substrate 1 are electrically connected by a conductive wire 5f.

In some examples, a semiconductor chip 3 can be electrically connected to the wiring substrate 1 via another semiconductor chip 3. In other examples, a conductive wire 5 making a chip-to-chip connection may instead connect between a semiconductor chip 3 the wiring substrate 1. For example, the end of conductive wire 5b depicted in FIG. 1 as being connected to the semiconductor chip 3a may instead be connected directly to wiring substrate 1. Here, arrangement of the conductive wire 5b will be described more specifically with reference to FIG. 2.

Figure 2:
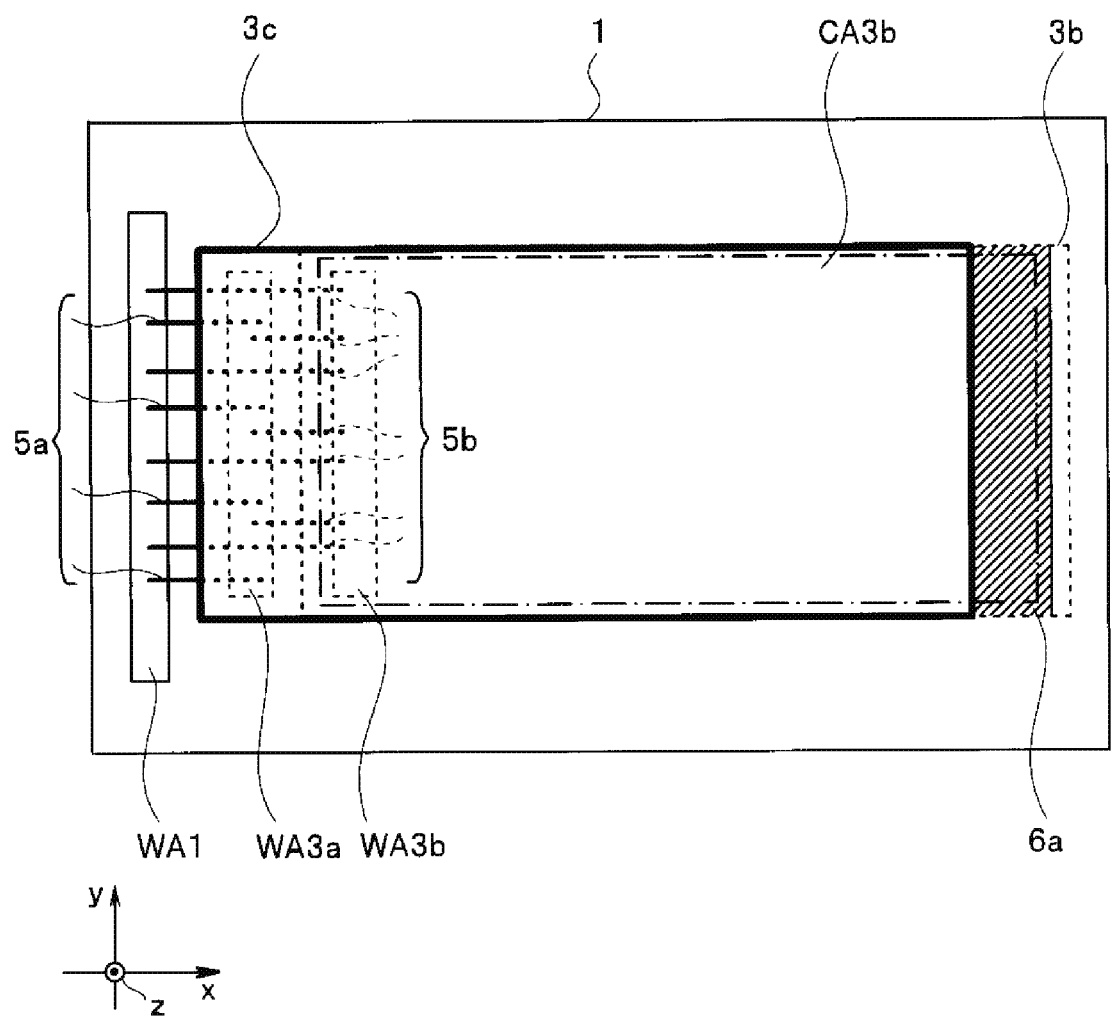
FIG. 2 is a plan view schematically showing aspects of a semiconductor device according to an embodiment as viewed from above.

FIG. 2 is a plan view schematically showing the structure of the semiconductor device 100 according to the present embodiment as viewed from above. FIG. 2 is a plan view after the semiconductor chips 3a to 3c are stacked but before the conductive wire 5c is bonded to the semiconductor chip 3c. In FIG. 2, the position of semiconductor chip 3b is indicated by a dotted line, and the position of semiconductor chip 3c is indicated by the heavy/thick line. The semiconductor chip 3a has the same planar shape as the semiconductor chip 3c when viewed from above, and is arranged to be at the same (overlapping in this view) position as the semiconductor chip 3a. Note, in the present disclosure, "the same" includes not only exactly the same or identical, but also includes, for example, normal variations occurring in the manufacturing processes. On each of the wiring substrate 1, the semiconductor chip 3a, and the semiconductor chip 3b, an electrode region including a plurality of electrodes (terminals) for connecting the conductive wires 5 is formed along one side on the left end side. More particularly, an electrode region WA1 is formed on the wiring substrate 1, an electrode region WA3a is formed on the semiconductor chip 3a, and an electrode region WA3b is formed on the semiconductor chip 3b.

The electrode region WA3a is formed on the upper surface of semiconductor chip 3a in a region left uncovered by the semiconductor chip 3b. That is, the semiconductor chip 3b does not overlap with the electrode region WA3a. The semiconductor chip 3c is arranged above the semiconductor chip 3a and is at the same/overlapping position, as viewed from above, as the semiconductor chip 3a. Therefore, the semiconductor chip 3c overhangs/covers the electrode region WA3. The conductive wire 5a that is connected to the electrode region WA3a passes through the space between the lower surface of the FOW 4a and the upper surface of the semiconductor chip 3a to be bonded to the electrode region WA1 of the wiring substrate 1.

On the other hand, the electrode region WA3b is covered by the FOW 4a. Accordingly, the conductive wire 5b connected to the electrode region WA3b will have to extend through the FOW 4a to reach either of the electrode region WA3a of the semiconductor chip 3a or the electrode region WA1 of the wiring substrate 1.

Thus, when an electrode region a semiconductor chip 3 will be covered by an adhesive layer attached to the lower surface of another semiconductor chip 3, the conductive wire (s) 5 connecting to that electrode region need to pass through the covering adhesive layer. That is, the conductive wire(s) 5 in some instances will need to pass/extend through an adhesive layer. For such instances, a FOW 4 is used instead of a DAF 2.

In a semiconductor device 100 corresponding to FIG. 1, the electrode region WA3b on the semiconductor chip 3b is formed in close contact with the adhesive layer (FOW) 4a attached to the lower surface of the semiconductor chip 3c, and the electrode region on the semiconductor chip 3d is formed in close contact with the adhesive layer (FOW) 4b attached to the lower surface of the semiconductor chip 3e. For this reason, conductive wires 5b conductive wires 5d need to pass through an adhesive layer contacting the upper surface of each of the semiconductor chips 3b and 3d. Therefore, a FOW 4 is used as the adhesive layer to be attached to the lower surfaces of the semiconductor chip 3c and the semiconductor chip 3e, and a DAF 2 is used as the adhesive layer to be attached to the lower surfaces of the semiconductor chips 3a, 3b, 3d, and 3f.

It is also possible to use a FOW 4 as the adhesive layer to be attached to the lower surfaces of the semiconductor chips 3a, 3b, 3d, and 3f. However, in view of the current demand/preference for thinner semiconductor devices 100, it is preferable to use a DAF 2 when possible since it is thinner than a FOW 4. Moreover, since there is a problem that the warpage occurs in the semiconductor chip 3 immediately below a FOW 4, it is preferable to use a DAF 2 in those places where a conductive wire 5 does not need to be embedded within a covering adhesive layer.

Figure 3:
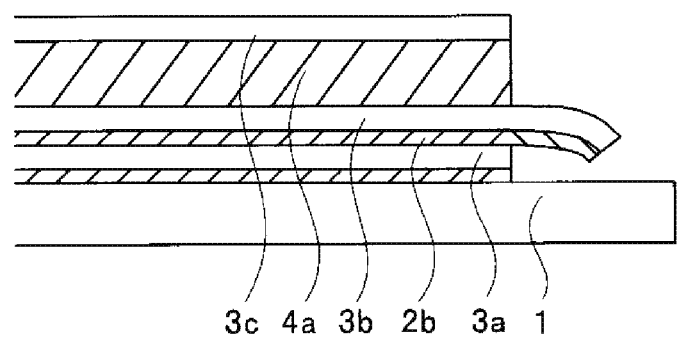
FIG. 3 is a cross-sectional view illustrating warpage of a semiconductor chip due to stress concentration.

FIG. 3 is a cross-sectional view for illustrating warpage of a semiconductor chip due to stress concentration. FIG. 3 is a schematic cross-sectional view of the vicinity of the right side of the chip stack after the semiconductor chips 3a to 3c have been stacked. FIG. 3 depicts a state in which a resin 6a has not been formed.

Generally, the adhesive layers expand with increases in temperature and decrease with decreases in temperature. That is, the film/layer volume increases with increasing temperature and decreases with decreasing temperature. Moreover, the greater the volume of the adhesive layer, the larger the volume change due to heating and cooling will be. In addition, the thermal expansion coefficient of the adhesive material is typically an order of magnitude greater than the thermal expansion coefficient of silicon, which generally comprises the bulk of the semiconductor chips 3. For this reason, in a high temperature environment (e.g., 100° C. or more), a difference occurs between the expansion of the adhesive material and silicon.

In the manufacturing process of the semiconductor device 100, when the semiconductor chips 3 are fixed to each other, a heat treatment of 100° C. or more is applied in order to thermally cure the adhesive material. The adhesive expands during heating and contracts with decreasing temperature (cooling) according to its thermal expansion coefficient. The FOW 4 being a thicker film and thus having a larger volume than the DAF 2 will have a relatively larger volume change in expansion and contraction, and therefore local stress will be generated at the surface of the semiconductor chip 3b immediately below the end of the FOW 4a. Therefore, warpage occurs at the portion of the semiconductor chip 3b that protrudes beyond the right end of the FOW 4 as shown in FIG. 3. In the semiconductor chip 3b, there is a possibility of a malfunction of a circuit portion formed in a warpage portion, this tends to lower the reliability of the semiconductor device.

In order to prevent the warpage of the semiconductor chip 3b as described above, the semiconductor device 1 according to the present embodiment is provided, as shown in FIG. 1, with the resin 6a as a coating continuously covering the right end side (edge) surface of the semiconductor chip 3c and the right end side (edge) surface of the FOW 4a. The resin 6a also covers the otherwise exposed portion of the upper surface of the semiconductor chip 3b that protrudes in the x-axis direction beyond the rightmost edge of the semiconductor chip 3c. Similarly, to prevent warpage of the semiconductor chip 3d, a resin 6b continuously covers from the right end side (edge) surfaces of the semiconductor chip 3e and the FOW 4b as well as the otherwise exposed portion of the upper surface of the semiconductor chip 3d that protrudes in the x-axis direction beyond the right edge of the semiconductor chip 3e.

The resins 6a and 6b are thermosetting resins having a thermal expansion coefficient equivalent to that of the FOW 4. In the present disclosure, "equivalent" includes not only strictly the same, but also, for example, normal variations resulting from manufacturing processes, and also includes a surrounding range of values providing substantially same the effects as exactly equal values or characteristics. Here, the planar region covered with the resins 6a and 6b will be further described with reference to FIG. 2. In FIG. 2, a circuit region CA3b (a region in which semiconductor elements, wirings, and the like are formed in chip) of the semiconductor chip 3b is indicated by a dashed-dotted rectangular area. Considering the possible shifts/variations in the cutting position during chip dicing a semiconductor wafer, a dicing line (or street) in which no circuit is formed is usually provided at the peripheral edge of the semiconductor chip 3b. For example, a dicing line covers an area of about 25 μm inwardly from the outer edge of the semiconductor chip 3b. That is, in FIG. 2, a dicing line region extends from the outer periphery of the circuit region CA3b, as indicated by the dashed-dotted line, to the outermost edge of the semiconductor chip 3b, which is indicated by the dotted line.

The resin 6a covers at least the entire portion of the circuit region CA3b located in the portion of the semiconductor chip 3b that protrudes beyond the end of the semiconductor chip 3c, which corresponds in this instance also to the positions of the outer edge the FOW 4a. Although the resin 6a formed on the semiconductor chip 3b is specifically described above, the resin 6b formed on the semiconductor chip 3d is also similarly formed. That is, the resin 6b is formed to cover at least the entire portion of the circuit region of the semiconductor chip 3d that protrudes beyond the outer edge of the semiconductor chip 3e and the FOW 4b.

In the semiconductor device 100, a sealing resin 7 (see FIG. 1) is ultimately formed on the first surface 1a side of the wiring substrate 1 in order to cover and seal all of the semiconductor chips 3 and the conductive wires 5.

Figure 4:
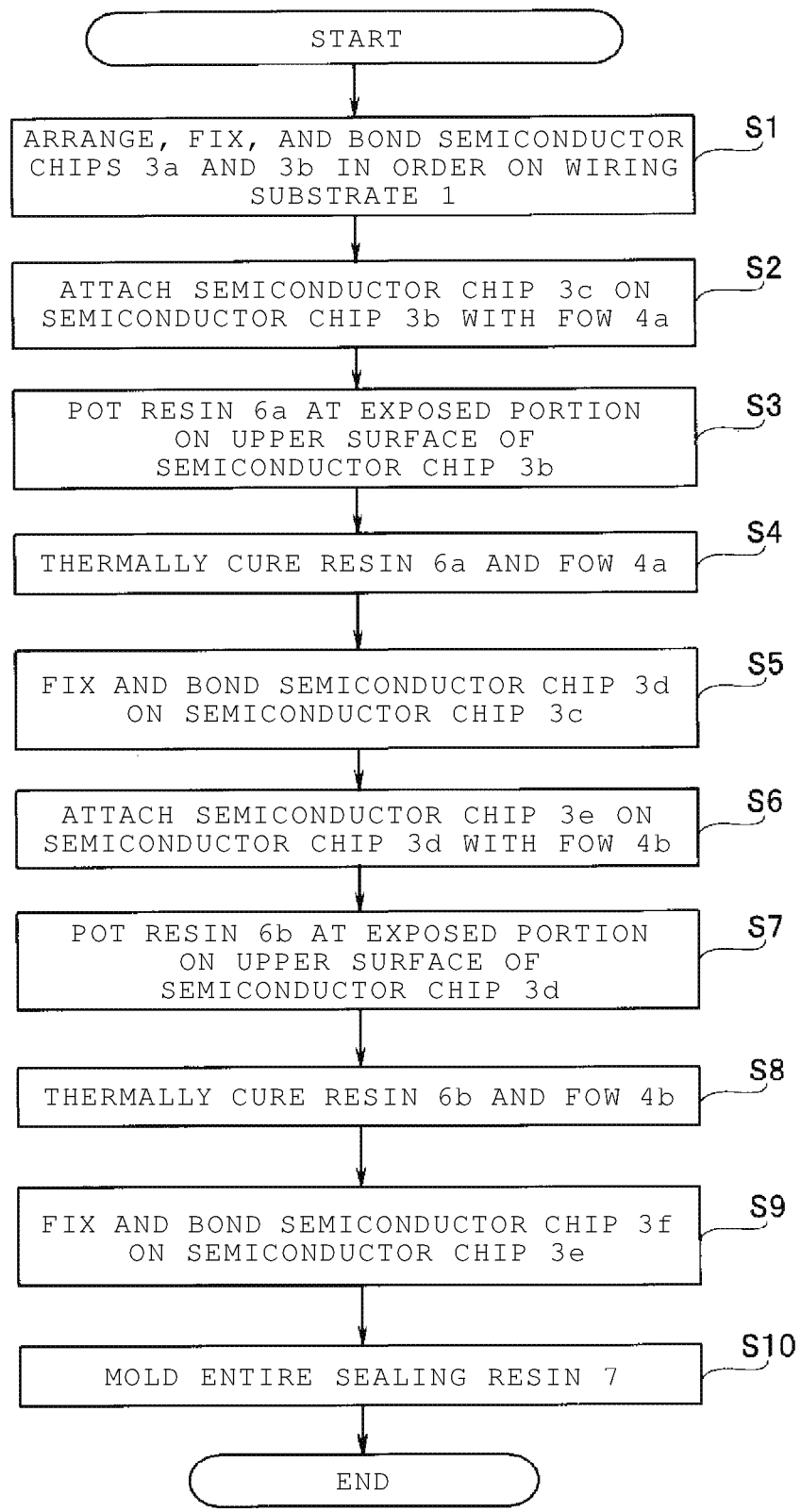
FIG. 4 is a flowchart showing an example of a manufacturing process of a semiconductor device according to an embodiment.

Next, a manufacturing method of the semiconductor device 100 will be described with reference to FIGS. 4 and 5A to 5J. FIG. 4 is a flowchart showing an example of the manufacturing process of a semiconductor device according to the present embodiment. FIGS. 5A to 5J are diagrams each showing a cross-sectional structure at a different point in the manufacturing process.

Figure 5A:
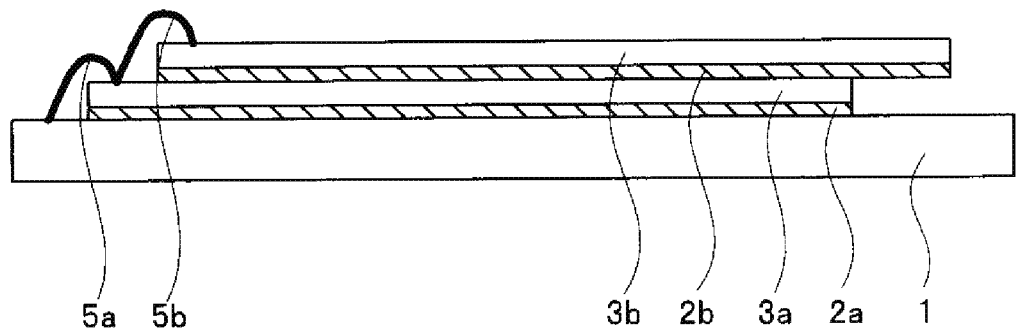
FIGS. 5A-J are a cross-sectional views depicting aspects of a manufacturing process of a semiconductor device of an embodiment.

First, the semiconductor chips 3a and 3b are fixed in order on the first surface 1a of the wiring substrate 1 and bonded (S1, see FIG. 5A). Specifically, the semiconductor chip 3a having the DAF 2a attached to the lower surface thereof is first arranged on the surface 1a of the wiring substrate 1. Then, the semiconductor chip 3b having the DAF 2b attached to the lower surface thereof is arranged at a predetermined position on the semiconductor chip 3a. This partial assembly is subjected to heat treatment to cure the DAFs 2a and 2b, and the wiring substrate 1 and the semiconductor chips 3a and 3b are thus fixed. Finally, the conductive wire 5a is bonded to the semiconductor chip 3a and the wiring substrate 1 to be electrically connected. Further, the semiconductor chip 3b and the wiring substrate 1, or the semiconductor chip 3b and the semiconductor chip 3a are bonded using the conductive wire 5b to be electrically connected.

Figure 5B:
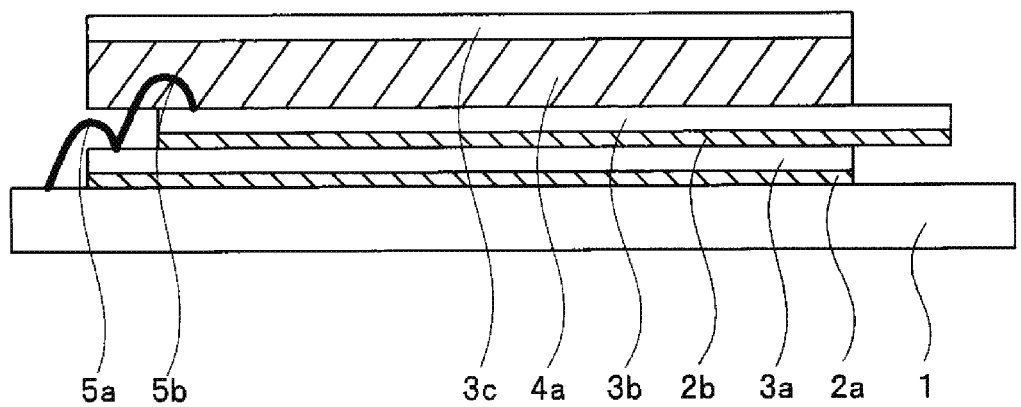

Subsequently, the semiconductor chip 3c having the FOW 4a attached to the lower surface thereof is arranged on the semiconductor chip 3b (S2, see FIG. 5B). At this point, the FOW 4a is in a semi-cured state. Accordingly, since the viscosity of the FOW 4a is low, a part of the conductive wire 5b already connected to the semiconductor chip 3b is embedded in the FOW 4a.

Figure 5C:
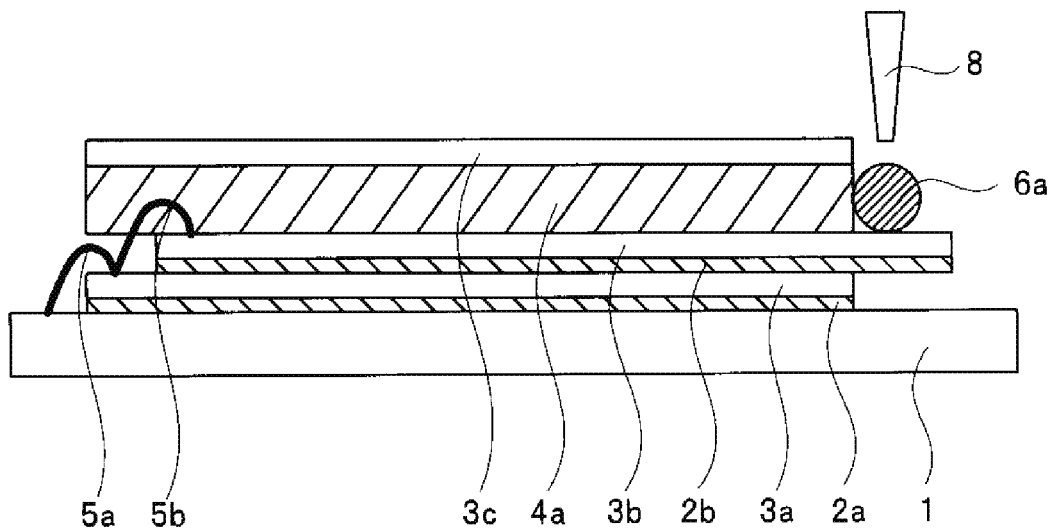
Figure 5D:
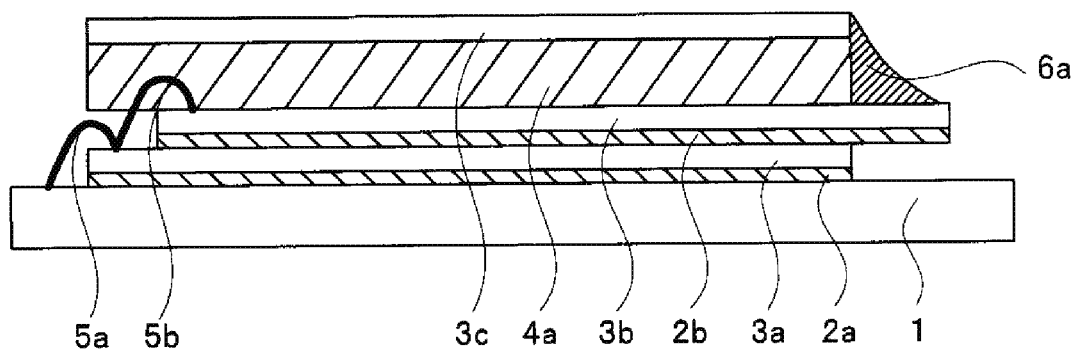

Then, on the still exposed portion of the upper surface of the semiconductor chip 3b, the resin 6a is potted from the upper side using a dispenser 8 or the like on the exposed portion protruding from the end of the FOW 4a (S3, see FIG. 5C). The resin 6a is preferably a resin having a thermal expansion coefficient equivalent to that of the FOW 4a. Next, the potted resin 6a spreads along the surface of the semiconductor chip 3b and the side surfaces of the semiconductor chip 3c and the FOW 4a. Next, heat treatment is performed to thermally cure the FOW 4a and the resin 6a (S4, see FIG. 5D). The boundary region between the FOW 4a and the resin 6a can meld into a continuous, substantially homogenous state with the heat treatment. The now cured resin 6a forms a continuous material that covers the side surface of the semiconductor chip 3c, the side surface of the FOW 4a, and at least the portion of circuit region CA3b on the upper surface of the semiconductor chip 3b.

Thus, by covering the circuit region CA3b on the exposed portion of the upper surface of the semiconductor chip 3b with the resin 6a and furthermore forming the resin 6a and the FOW 4a in close sequence, even when the heat treatment is applied in the subsequent processing (or when the completed semiconductor device 100 operates at a high temperature), it is possible to prevent stress from being locally applied from the FOW 4a to the upper surface of the semiconductor chip 3b. Therefore, it is possible to prevent the malfunction of the circuit(s) formed in the semiconductor chip 3b and to improve the reliability of the semiconductor device 100.

Figure 5E:
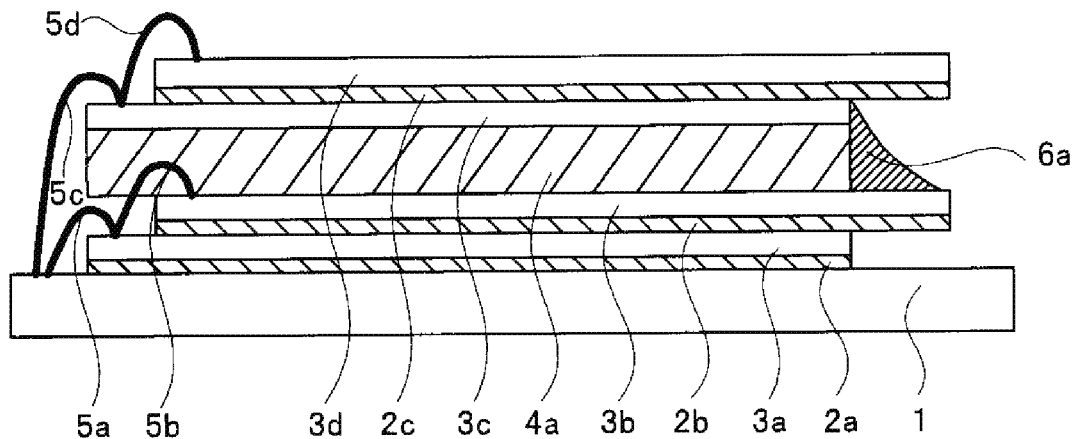

In further processing, the semiconductor chip 3d is fixed on the semiconductor chip 3c and bonded (S5, see FIG. 5E). Specifically, the semiconductor chip 3d having the DAF 2c attached to the lower surface thereof is first arranged at a predetermined position on the semiconductor chip 3c. This partial assembly is then subjected to heat treatment to cure the DAF 2c, and the semiconductor chips 3c and 3d are thus fixed to each other. Then, the semiconductor chip 3c and the wiring substrate 1 are electrically connected using a conductive wire 5c. Furthermore, the semiconductor chip 3d and the wiring substrate 1 (or the semiconductor chip 3d and the semiconductor chip 3c) are electrically connected using a conductive wire 5d.

Figure 5F:
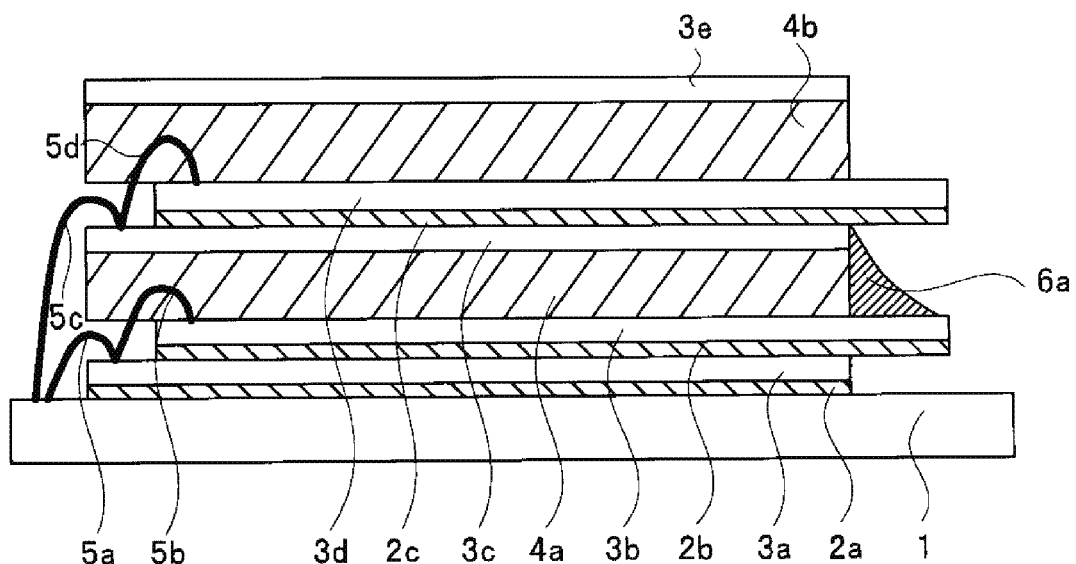

Next, the semiconductor chip 3e having FOW 4b attached to the lower surface thereof is arranged on the semiconductor chip 3d (S6, see FIG. 5F). At this time, the FOW 4b is still in a semi-cured state. Accordingly, since the viscosity of the FOW 4b is low, a part of the conductive wire 5d already connected to the semiconductor chip 3d can be embedded in the FOW 4b.

Figure 5G:
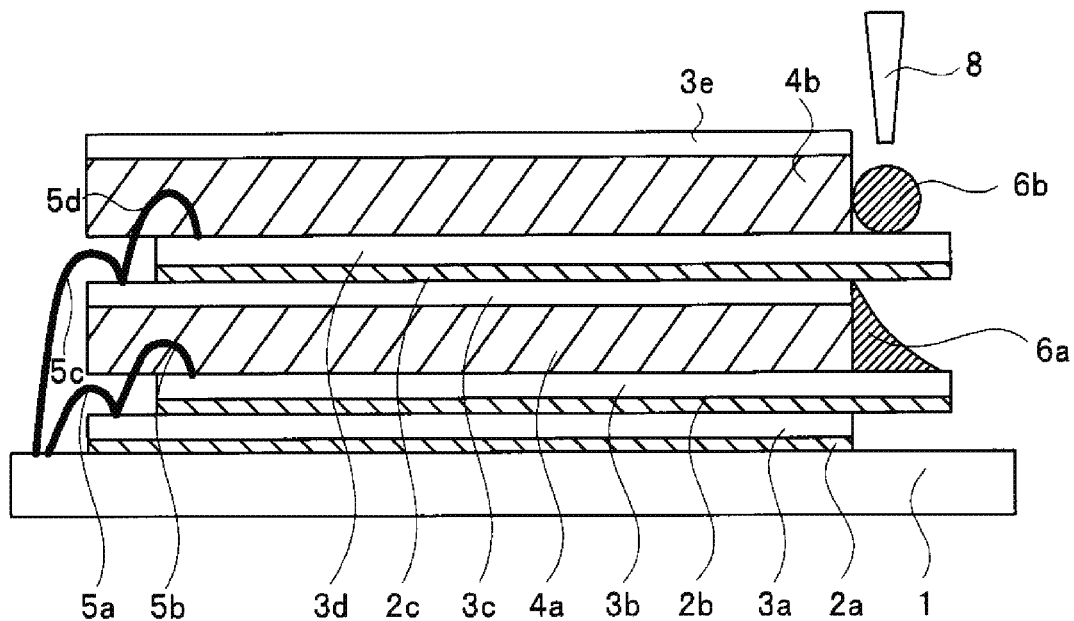
Figure 5H:
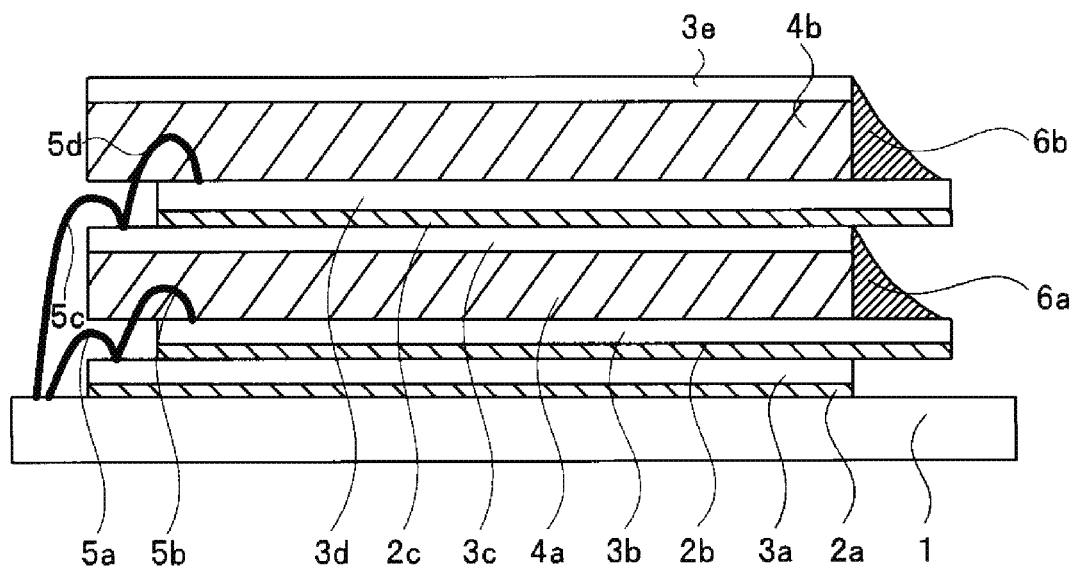

Then, on the still exposed portion of surface of the semiconductor chip 3d, the resin 6b is potted from the upper side using the dispenser 8 or the like on the exposed portion protruding beyond the end of the FOW 4b (S7, see FIG. 5G). The resin 6b is preferably a resin having a thermal expansion coefficient equivalent to that of the FOW 4b. Next, the potted resin 6b spreads to cover the upper surface of the semiconductor chip 3d and the side (edge) surfaces of the semiconductor chip 3e and the FOW 4b. Subsequently, heat treatment is performed to thermally cure the FOW 4b and the resin 6b (S8, see FIG. 5H). By the heat treatment, the boundary portion between the FOW 4b and the resin 6b is made in a continuous state. The now cured resin 6b covers at least the portion of the circuit region of the semiconductor chip 3d not covered by the FOW 4b, as well as the side surfaces of the semiconductor chips 3e and FOW 4b.

By covering the portion of the circuit region of the semiconductor chip 3d with the resin 6b and further forming the resin 6b and the FOW 4b in close sequence, when heat treatment is applied in subsequent processing (or the completed semiconductor device 100 operates in extreme temperature environments), it is possible to prevent stress from being locally applied from the FOW 4b to the surface of the semiconductor chip 3d. Therefore, it is possible to prevent malfunction of the circuit (s) formed in the semiconductor chip 3d and to improve the reliability of the semiconductor device 100.

Figure 5I:
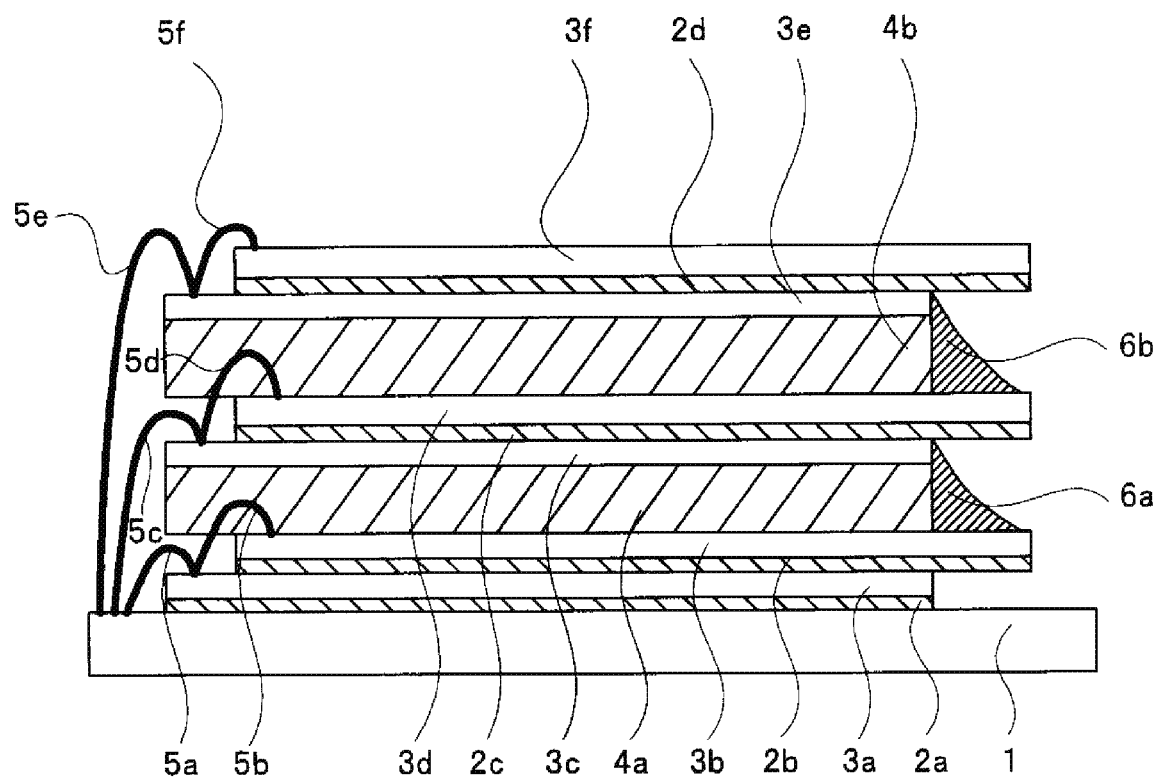

Subsequently, the semiconductor chip 3f is fixed to the semiconductor chip 3e (S9, see FIG. 5I). Specifically, the semiconductor chip 3f having the DAF 2d attached to the lower surface thereof is first arranged at a predetermined position on the semiconductor chip 3e. The assembly is then subjected to heat treatment to cure the DAF 2d, and the semiconductor chips 3e and 3f are thus fixed to each other. Then, the semiconductor chip 3e and the wiring substrate 1 are electrically connected using a conductive wire 5e. The semiconductor chip 3f and the wiring substrate 1 (or the semiconductor chip 3f and the semiconductor chip 3e) are electrically connected using a conductive wire 5f.

Figure 5J:
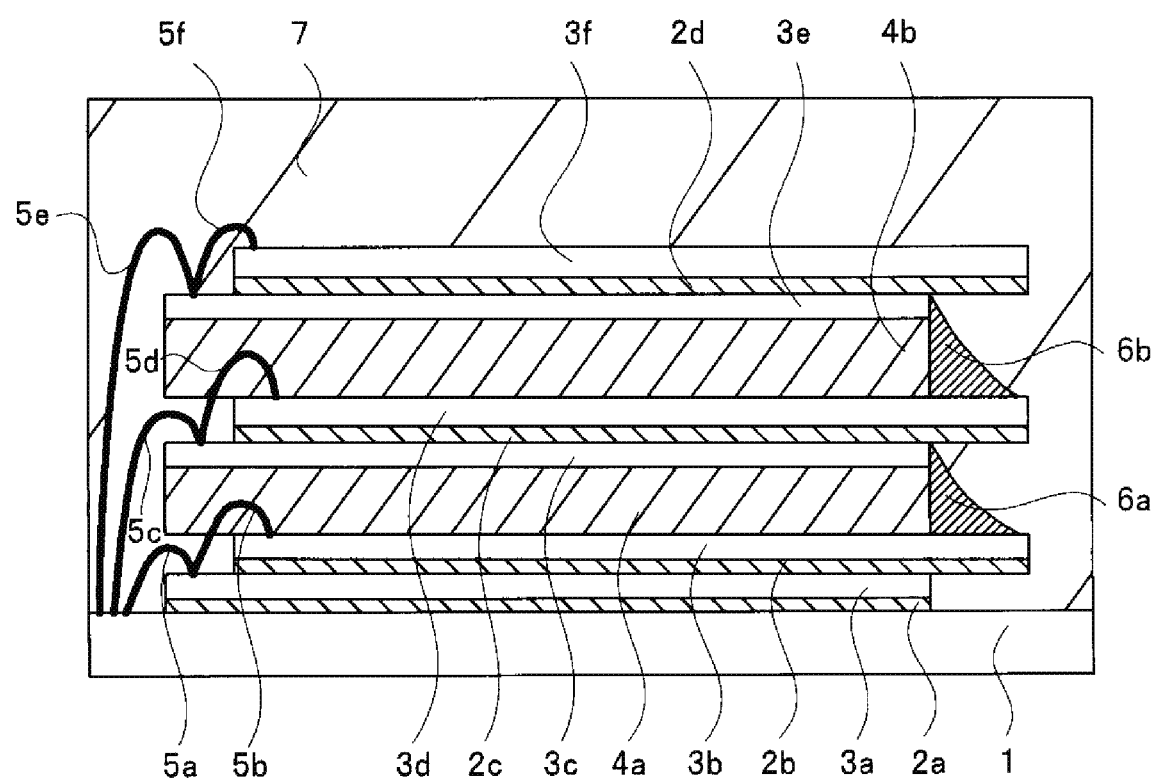

When all the semiconductor chips 3 have been fixed and electrically connected to the wiring substrate 1 via the conductive wires 5, the stacked semiconductor chips 3 and the bonded conductive wires 5 are molded with the sealing resin 7 (S10, see FIG. 5J). At predetermined positions on the second surface 1b of the wiring substrate 1, external terminals for BGA packages (protruding terminals using solder balls or the like) or external terminals for LGA packages (metal lands using metal plating or the like) are formed, and the semiconductor device 100 is completed.

As described above, according to the present embodiment, a semiconductor device has a plurality of stacked semiconductor chips. Some of the chips are adhere to an adjacent chip with a thick adhesive material, such as the FOW 4, to better permit bonding wires or the like from the upper surface a chip to pass through the adhesive material. However, the thick adhesive material and the chips may experience differential thermal expansion causing the potential to cause stresses in the chip (s) particularly at certain edge/end portions of chips not covered by adhesive material. However, in the present embodiment a resin material, such as resin 6, which has a thermal expansion coefficient equivalent of the adhesive material (e.g., FOW 4) is applied to cover edge/end portions of the chips adjacent to a thick adhesive layer. Additionally, since resin material (resin 6) contacts the adhesive material (FOW 4) to form a continuous covering, it is possible to prevent stress from being locally applied from the thick adhesive material (FOW 4) to the semiconductor chip, more particularly, a circuit region of the chip on a surface thereof. Therefore, it is possible to limit malfunctions of the circuits formed in the semiconductor chip (e.g., chip 3) and to improve the reliability of the semiconductor device.

The method of forming the resin 6 on the protruding portion of the semiconductor chip 3 is not limited to the above-described potting method, and may the resin 6 may be formed using other methods. Further, the number of semiconductor chips 3 to be stacked and the amount and direction of horizontal displacement with respect to the upper and lower semiconductor chips 3 are not limited to the above-described example.

While certain embodiments have been described, these embodiments have been presented by way of example only, and are not intended to limit the scope of the present disclosure. Indeed, the novel embodiments described herein may be embodied in a variety of other forms; furthermore, various omissions, substitutions and changes in the form of the embodiments described herein may be made without departing from the spirit of the present disclosure. The accompanying claims and their equivalents are intended to cover such forms or modifications as would fall within the scope and spirit of the present disclosure.

What is claimed is:

1. A semiconductor device, comprising:
a wiring substrate;
a first semiconductor chip on the wiring substrate;
a second semiconductor chip adhered to a first region of an upper surface of the first semiconductor chip with a first adhesive layer, the second semiconductor chip being positioned such that a second region of the upper surface of the first semiconductor is not overlapped by the second semiconductor chip, the first adhesive layer covering a lower surface of the second semiconductor chip but not the second region;
a third semiconductor chip adhered to a third region of an upper surface of the second semiconductor chip with a second adhesive layer, the third semiconductor chip being positioned such that a fourth region of the upper surface of the second semiconductor chip is not overlapped by the third semiconductor chip, the second adhesive layer covering a lower surface of the third semiconductor chip but not the fourth region, an end portion of the second adhesive layer being above the second region but not contacting the second region; and
a coating covering the fourth region, an end surface of the second adhesive layer adjacent to the fourth region, and an end surface of the third semiconductor chip adjacent to the end surface of the second adhesive layer.

2. The semiconductor device according to claim 1, wherein the coating is a thermosetting resin.

3. The semiconductor device according to claim 1, wherein the coating has a thermal expansion coefficient equivalent to a thermal expansion coefficient of the second adhesive layer.

4. The semiconductor device according to claim 1, wherein the coating has a surface that extends from the end surface of the third semiconductor chip to an outer edge of the fourth region.

5. The semiconductor device according to claim 1, further comprising:
a fourth semiconductor chip adhered to an upper surface third semiconductor chip with a third adhesive layer.

6. The semiconductor device according to claim 1, further comprising:
a bonding wire extending from the third region to the second region, a portion of the bonding wire being embedded in the second adhesive layer.

7. The semiconductor device according to claim 1, further comprising:
a sealing resin covering the first, second, and third semiconductor chips, the coating, and an upper surface of the wiring substrate.

8. The semiconductor device according to claim 1, wherein the second adhesive layer is thicker than the first adhesive layer.

9. The semiconductor device according to claim 1, wherein the first adhesive layer is a die attach film.

10. The semiconductor device according to claim 1, wherein the second adhesive layer is a film-on-wire layer.

11. The semiconductor device according to claim 1, wherein the coating is a potting resin.

12. The semiconductor device according to claim 1, further comprising:
a first bonding wire extending from the third region to the second region, a portion of the bonding wire being embedded in the second adhesive layer;
a second bonding wire extending from the second region to the wiring substrate; and
a sealing resin covering the first, second, and third semiconductor chips, the coating, the first bonding wire, the second bonding wire, and an upper surface of the wiring substrate.

13. The semiconductor device according to claim 12, wherein
the second adhesive layer is thicker than the first adhesive layer,
the coating has a thermal expansion coefficient equivalent to a thermal expansion coefficient of the second adhesive layer, and
the coating has a surface that extends from the end surface of the third semiconductor chip to an outer edge of the fourth region.

14. The semiconductor device according to claim 1, wherein at least one of the first, second, and third semiconductor chips is a NAND flash memory chip.

15. A semiconductor device, comprising:
a wiring substrate having a first surface;
a first semiconductor chip spaced from the first surface in a first direction orthogonal to the first surface;
a second semiconductor chip adhered to a first region of a second surface of the first semiconductor chip with a first adhesive layer, the second semiconductor chip being positioned such that a second region of the second surface is not overlapped in plan view along the first direction by the second semiconductor chip, the first adhesive layer covering a third surface of the second semiconductor chip facing towards the wiring substrate;

a third semiconductor chip adhered to a third region of a fourth surface of the second semiconductor chip with a second adhesive layer, the fourth surface facing away from the wiring substrate, the third semiconductor chip being positioned such that a fourth region of the fourth surface is not overlapped by the third semiconductor chip in plan view along the first direction, the second adhesive layer covering a fifth surface of the third semiconductor chip facing towards the wiring substrate but the second adhesive layer does not cover the fourth region of the fourth surface, an end portion of the second adhesive layer in a second direction perpendicular to the first direction is spaced from the second region in the first direction; and a coating covering the fourth region, an end surface of the second adhesive layer adjacent to the fourth region in the second direction, and an end surface of the third semiconductor chip adjacent to the end surface of the second adhesive layer in the first direction.

16. The semiconductor device according to claim 15, wherein the second adhesive layer is thicker in the first direction than the first adhesive layer.

17. The semiconductor device according to claim 15, wherein the coating has a thermal expansion coefficient equivalent to a thermal expansion coefficient of the second adhesive layer.

18. The semiconductor device according to claim 15, further comprising:

a bonding wire extending from the third region to the second region, a portion of the bonding wire extending through the second adhesive layer; and a sealing resin covering the first, second, and third semiconductor chips, the coating, the bonding wire, and the first surface of the wiring substrate.

19. A method of making a semiconductor device, comprising:

placing a first semiconductor chip on a wiring substrate;

adhering a second semiconductor chip to a first region of an upper surface of the first semiconductor chip with a first adhesive layer, the second semiconductor chip being positioned such that a second region of the upper surface of the first semiconductor is not overlapped by the second semiconductor chip, wherein the first adhesive layer covers a lower surface of the second semiconductor chip but not the second region;

adhering a third semiconductor chip to a third region of an upper surface of the second semiconductor chip with a second adhesive layer, the third semiconductor chip being positioned such that a fourth region of the upper surface of the second semiconductor chip is not overlapped by the third semiconductor chip, wherein the second adhesive layer covers a lower surface of the third semiconductor chip but not the fourth region, an end portion of the second adhesive layer is above the second region but not contacting the second region; and forming a coating covering the fourth region, an end surface of the second adhesive layer adjacent to the fourth region, and an end surface of the third semiconductor chip adjacent to the end surface of the second adhesive layer.

20. The method of claim 19, wherein the coating is formed by a potting method.

* * * * *